US008706467B2

(12) United States Patent
Rabinovitch et al.

(10) Patent No.: US 8,706,467 B2
(45) Date of Patent: Apr. 22, 2014

(54) COMPACT CIRCUIT-SIMULATION OUTPUT (75) Inventors: Alexander Rabinovitch, Shrewsbury, MA (US); Manish Shroff, Marlborough, MA (US)

(73) Assignee: Synopsys, Inc., Mountain View, CA (US)

( * ) Notice: Subject to any disclaimer, the term of this patent is extended or adjusted under 35 U.S.C. 154(b) by 617 days.

(21) Appl. No.: 12/060,984

(22) Filed: Apr. 2, 2008

(65) Prior Publication Data

US 2009/0254331 A1 Oct. 8, 2009

(51) Int. Cl.
*G06F 17/50* (2006.01)

(52) U.S. Cl.
USPC .................................. 703/14; 703/13; 703/16

(58) Field of Classification Search
USPC ................................. 703/13–19; 716/4–6, 18
See application file for complete search history.

(56) References Cited

U.S. PATENT DOCUMENTS

| 2,859,962 | A | * | 11/1958 | Beveridge et al. | 226/94 |
|---|---|---|---|---|---|
| 4,922,445 | A | * | 5/1990 | Mizoue et al. | 703/15 |
| 5,023,486 | A | * | 6/1991 | Gongwer | 326/38 |
| 5,263,149 | A | * | 11/1993 | Winlow | 703/15 |
| 5,345,401 | A | * | 9/1994 | Tani | 703/16 |
| 5,378,934 | A | * | 1/1995 | Takahashi et al. | 327/203 |
| 5,400,270 | A | * | 3/1995 | Fukui et al. | 703/19 |
| 5,737,583 | A | * | 4/1998 | Jones et al. | 703/14 |
| 5,905,883 | A | * | 5/1999 | Kasuya | 703/17 |
| 5,953,519 | A | * | 9/1999 | Fura | 716/18 |
| 6,031,386 | A | * | 2/2000 | Cole et al. | 324/765 |
| 6,212,665 | B1 | * | 4/2001 | Zarkesh et al. | 716/109 |
| 6,230,115 | B1 | * | 5/2001 | Ohsaki et al. | 703/19 |
| 6,307,615 | B1 | * | 10/2001 | Ito | 355/40 |
| 6,389,379 | B1 | * | 5/2002 | Lin et al. | 703/14 |
| 6,493,659 | B1 | * | 12/2002 | Takita | 703/14 |
| 6,539,341 | B1 | | 3/2003 | Weimin | |
| 6,629,299 | B1 | * | 9/2003 | Iwanishi | 716/6 |
| 6,650,142 | B1 | * | 11/2003 | Agrawal et al. | 326/41 |
| 6,718,529 | B1 | * | 4/2004 | Iwanishi | 716/6 |
| 6,828,815 | B2 | * | 12/2004 | Ishida et al. | 324/765 |
| 6,838,904 | B1 | * | 1/2005 | Agrawal et al. | 326/41 |
| 6,965,606 | B2 | * | 11/2005 | Bhardwaj | 370/428 |
| 6,975,978 | B1 | * | 12/2005 | Ishida et al. | 703/15 |
| 6,985,840 | B1 | * | 1/2006 | Hsu et al. | 703/7 |
| 7,107,557 | B2 | * | 9/2006 | Iwanishi | 716/6 |
| 7,340,700 | B2 | * | 3/2008 | Emerson et al. | 716/4 |
| 7,464,354 | B2 | * | 12/2008 | Birmiwal et al. | 716/6 |
| 7,925,899 | B2 | * | 4/2011 | Gumma et al. | 713/300 |
| 2002/0156609 | A1 | * | 10/2002 | Hirata et al. | 703/14 |
| 2003/0107401 | A1 | * | 6/2003 | Agrawal et al. | 326/39 |
| 2003/0125918 | A1 | | 7/2003 | Rich et al. | |
| 2003/0204828 | A1 | * | 10/2003 | Iwanishi | 716/6 |
| 2004/0260527 | A1 | * | 12/2004 | Stanculescu | 703/14 |

(Continued)

*Primary Examiner* — Omar Fernandez Rivas
*Assistant Examiner* — Kibrom Gebresilassie
(74) *Attorney, Agent, or Firm* — Park, Vaughan, Fleming & Dowler LLP; Steven E. Stupp (57) ABSTRACT

Embodiments of a computer system for simulating a circuit are described. During a first mode of the simulation, the computer system stores primary signals and circuit relationships between primary signals and secondary signals associated with a portion of the circuit in a file, where the primary signals are independent of gate outputs in the portion of the circuit, and the secondary signals are driven by gates in the portion of the circuit. Moreover, during a second mode of the simulation, the computer system stores dynamic changes in additional relationships between signals to the file, where the signals can include primary signals, secondary signals, or both.

21 Claims, 5 Drawing Sheets

(56) References Cited

U.S. PATENT DOCUMENTS

| | | |
|---|---|---|
| 2004/0267489 A1 | 12/2004 | Reblewski |
| 2006/0004557 A1* | 1/2006 | Maturana et al. ............... 703/14 |
| 2007/0174805 A1* | 7/2007 | Hsu et al. ........................ 716/18 |
| 2008/0134107 A1* | 6/2008 | Wang et al. ....................... 716/2 |
| 2010/0247119 A1* | 9/2010 | Kawahara ....................... 399/35 |

\* cited by examiner

```
┌─────────────────────────────────────────────────────────────────────┐
│ DURING A FIRST MODE OF A CIRCUIT SIMULATION, STORE PRIMARY SIGNALS  │
│ AND RELATIONSHIPS BETWEEN PRIMARY SIGNALS AND SECONDARY SIGNALS     │
│    ASSOCIATED WITH A PORTION OF THE CIRCUIT TO A FILE, WHERE THE    │
│  PRIMARY SIGNALS ARE INDEPENDENT OF GATE OUTPUTS IN THE PORTION OF  │
│   THE CIRCUIT, AND WHERE THE SECONDARY SIGNALS ARE DRIVEN BY GATES  │
│                      IN THE PORTION OF THE CIRCUIT                  │
│                                 310                                 │
└─────────────────────────────────────────────────────────────────────┘
                                    ▼
┌─────────────────────────────────────────────────────────────────────┐
│   DURING A SECOND MODE OF THE CIRCUIT SIMULATION, STORE DYNAMIC     │
│   CHANGES IN RELATIONSHIPS BETWEEN SIGNALS TO THE FILE, WHERE THE   │
│   SIGNALS CAN INCLUDE PRIMARY SIGNALS, SECONDARY SIGNALS, OR BOTH   │
│                                 312                                 │
└─────────────────────────────────────────────────────────────────────┘
                                    ▼
┌─────────────────────────────────────────────────────────────────────┐
│  GENERATE ONE OF THE SECONDARY SIGNALS BASED ON ONE OR MORE OF      │
│ THE PRIMARY SIGNALS AND THE RELATIONSHIPS STORED TO THE FILE FOR A  │
│   TIME OTHER THAN WHEN THERE WAS A CHANGE IN THE RELATIONSHIPS      │
│                             (OPTIONAL)                              │
│                                 314                                 │
└─────────────────────────────────────────────────────────────────────┘
```

COMPACT CIRCUIT-SIMULATION OUTPUT

BACKGROUND

1. Field of the Invention

Embodiments of the present invention relate to circuit simulators. More specifically, embodiments of the present invention relate to a method and an apparatus for reducing the size of circuit-simulation output files.

2. Related Art

Simulations are routinely used during the design of circuits. To facilitate debugging of a circuit design, circuit simulators often export simulated values or waveforms for design parameters to an external file, which can be subsequently used by a post-processing tool and/or a debugging tool.

One problem with existing circuit simulators is that they typically export all of the simulated values or waveforms to the external file. Consequently, the size of the external file may be very large, which adversely impacts performance (such as a circuit-simulation time) and increases the expense associated with simulations.

Hence, there is a need for an apparatus and a technique that reduces the size of the external file while facilitating post processing of simulation results and/or debugging of circuits without the above-described problems.

SUMMARY

One embodiment of this invention provides a computer system for simulating a circuit. During a first mode of the simulation, the computer system stores primary signals and circuit relationships between primary signals and secondary signals associated with a portion of the circuit in a file, where the primary signals are independent of gate outputs in the portion of the circuit, and the secondary signals are driven by gates in the portion of the circuit. Moreover, during a second mode of the simulation, the computer system stores dynamic changes in additional relationships between signals to the file, where the signals can include primary signals, secondary signals, or both.

In some embodiments, the dynamic changes include events that indicate a temporal transition in the additional relationships. These events may be associated with a debugging application. For example, the events may include: forcing at least one of the signals to have a predetermined waveform (such as a fixed value) and/or discontinuing the forcing of at least one of the signals to have the predetermined value. Additionally, the events may include: setting the signals to be identical to each other and/or discontinuing the setting of the signals to be identical to each other.

In some embodiments, the computer system generates one of the secondary signals based on the one or more of the primary signals and the circuit relationships stored to the file for a time other than when there was a change in the additional relationships. For example, generating the secondary signal may involve evaluating the circuit relationships using priority queuing. Note that the secondary signal may be generated after the simulation is completed. Moreover, note that the secondary signal may be generated using a separate application from that used to perform the simulation.

In some embodiments, the circuit relationships include a gate-circuit topology in the portion of the circuit. Moreover, at least one gate in the portion of the circuit may have an associated delay.

In some embodiments, the first mode facilitates reducing the size of the file relative to the size when the file includes the primary signals and the secondary signals. Moreover, the first mode may facilitate faster simulations than when the primary signals and the secondary signals are stored to the file.

In some embodiments, the simulation includes a Verilog simulation. Moreover, the simulation may include simulation of circuitry specified in a very-high-speed-integrated-circuit-hardware-description language (VHDL).

In some embodiments, the portion of the circuit includes the entire circuit.

Another embodiment provides a method for simulating the circuit, which may be performed by the computer system. This method may include at least some of the preceding operations.

Another embodiment provides a computer-program product for use in conjunction with the computer system. This computer-program product may include instructions corresponding to at least some of the preceding operations.

Another embodiment provides an integrated circuit configured to simulate the circuit. During the first mode of the simulation, the integrated circuit is configured to store primary signals and circuit relationships between primary signals and secondary signals associated with the portion of the circuit in the file, where the primary signals are independent of gate outputs in the portion of the circuit, and the secondary signals are driven by gates in the portion of the circuit. Moreover, during the second mode of the simulation, the integrated circuit is configured to store dynamic changes in additional relationships between signals to the file, where the signals can include primary signals, secondary signals, or both.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, an integrated circuit, and a computer-program product (i.e., software) for use with the computer system are described. These systems, integrated circuits, software, and processes may be used to simulate a circuit, and may facilitate debugging of the circuit. In particular, during the simulation, primary signals associated with a portion of the circuit, as well as circuit relationships between the primary signals and secondary signals associated with the portion of the circuit, may be output to a file (in particular, simulated values of the primary signals at times during a time interval may be stored). These primary signals may be independent of gate outputs in the portion of the circuit, and the secondary signals may be driven by gates in the portion of the circuit. Moreover, the circuit relationships may include a gate-circuit topology in the portion of the circuit.

Additionally, during the simulation, when there are dynamic changes in additional relationships between signals (such as the primary signals and/or secondary signals), this information may be output to the file. These dynamic changes may include events (such as those associated with a debugging application) that indicate a temporal transition in the additional relationships. For example, the events may include: forcing at least one of the signals to have a predetermined waveform (such as a fixed value); discontinuing the forcing of at least one of the signals to have the predetermined value; setting the signals to be identical to each other; and/or discontinuing the setting of the signals to be identical to each other.

After the simulation is completed, one or more of the primary signals and the circuit relationships stored to the file may be used to generate one of the secondary signals for a time other than when there was a change in the additional relationships. For example, generating the secondary signal may involve evaluating the circuit relationships using priority queuing. Note that the secondary signal may be generated using a separate application from that used to perform the simulation. This separate application may include: a post-processing application, a waveform viewer, and/or a debugging tool.

By storing the primary signals and circuit representations to the file (and by not storing the secondary signals to the file), this technique facilitates reducing the size of the file relative to the size when the primary signals and the secondary signals are stored. In turn, this reduction in the size of the file uses fewer system resources (such as memory) and facilitates faster simulations, both of which can reduce the expense associated with the simulation.

In the discussion that follows, the simulation may include a Verilog simulation. Moreover, the simulation may include simulation of circuitry specified in a very-high-speed-integrated-circuit-hardware-description language (VHDL). Moreover, in some embodiments the simulation may be performed by an integrated circuit, such as a field-programmable gate array (FPGA) that is configured to perform the simulation.

Note that the simulation techniques may be implemented as a stand-alone software application, or as a program module or subroutine in another application, such as a circuit simulator. Furthermore, the software application may be configured to execute on a computer, such as: a personal computer, a laptop computer, a server, a work station, a main-frame computer, or other device capable of manipulating computer-readable data. Note that the computer may be at one location or may be distributed across multiple locations, such as computing systems that communication via a network (such as the Internet or an intranet). Consequently, information associated with the simulation may be stored locally (such as on a computer) and/or remotely (for example, on another computer or server that is accessed via a network).

Figure 1:
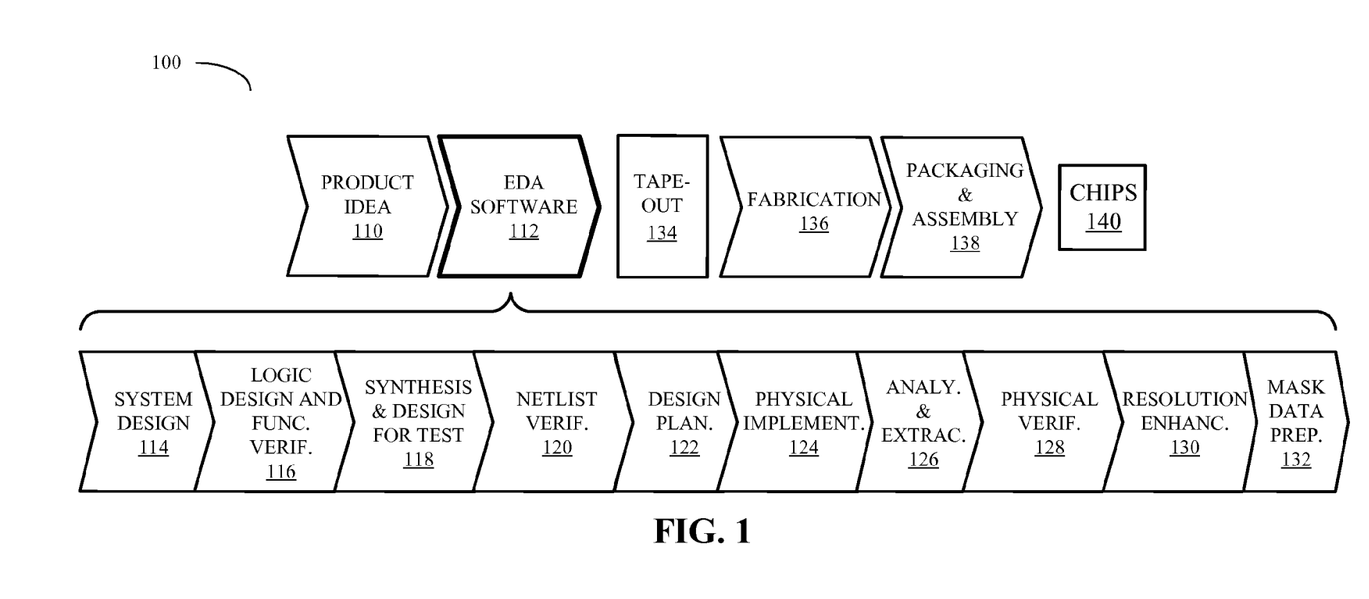
FIG. 1 is flowchart illustrating various operations in the design and fabrication of an integrated circuit in accordance with an embodiment of the present invention.

We now describe embodiments of design and fabrication of integrated circuits or chips. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

The design process that uses EDA software (112) includes operations 114-132, which are described below. Note that this design flow description is for illustration purposes only. This description is not meant to limit the present invention. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber®, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the Cats® family of products.

Embodiments of the present invention can be used during one or more of the above-described stages. Specifically, in some embodiments the present invention can be used during system design (114) and/or logic design and functional verification (116).

Figure 2:
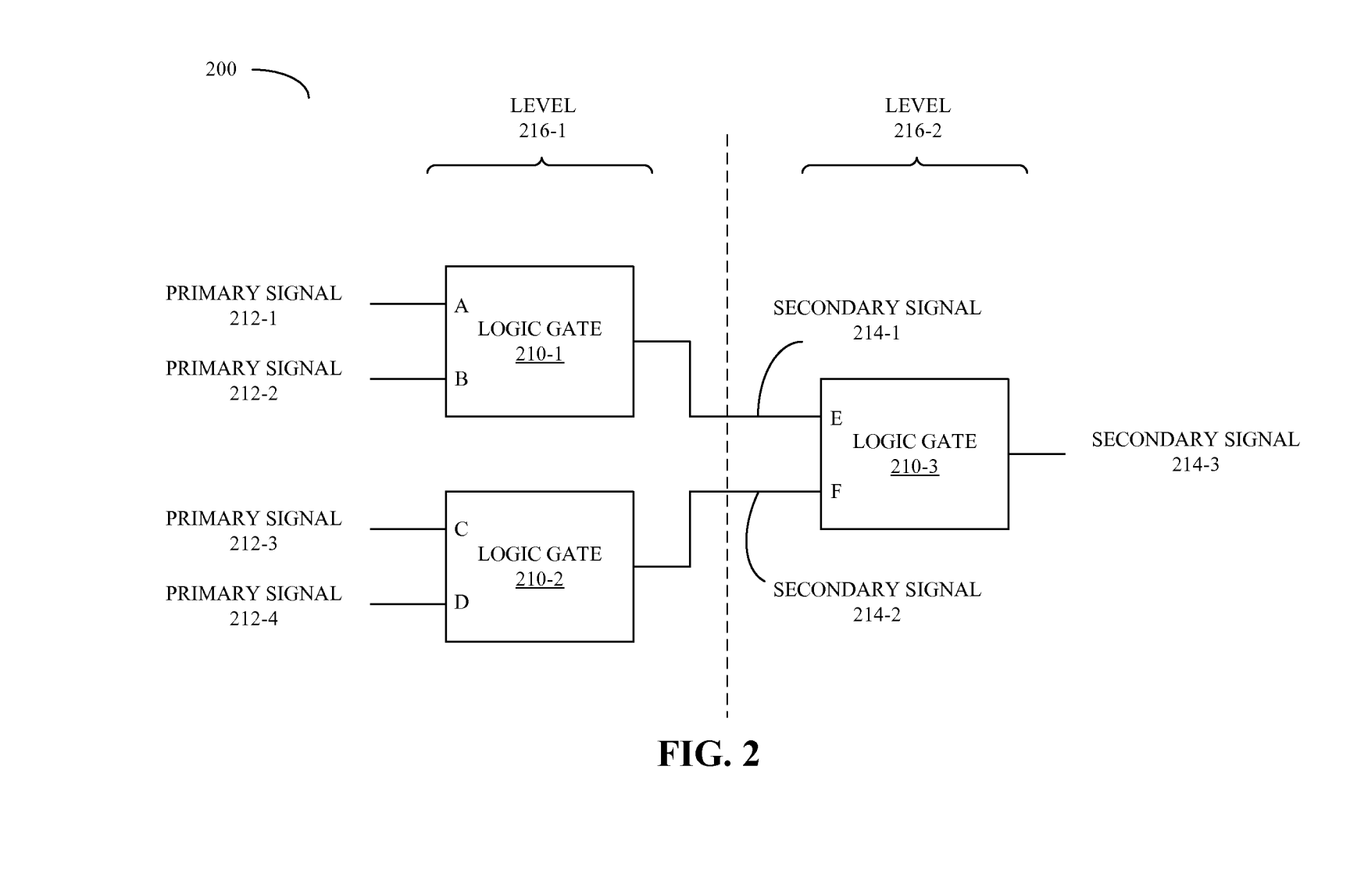
FIG. 2 is a block diagram illustrating a circuit in accordance with an embodiment of the present invention.

We now describe embodiments of systems, devices and processes for simulating a circuit. FIG. 2 presents a block diagram illustrating a circuit 200. This circuit includes logic gates 210 that include one or more transistors, such as AND gates. More generally, there are typically several equivalent ways to define a type of gate. For example, in Verilog an AND gate can be specified by: 'and g1(o, i1, i2);' 'assign o=i1 &i2;' and 'always_comb o=i1&i2.' In the discussion that follows, all Verilog constructs that are mapped into a gate by a synthesis tool are considered gates.

Note that inputs to logic gates 210-1 and 210-2 are primary signals 212, while inputs to logic gate 210-3 and an output of logic gate 210-3 are secondary signals 214, i.e., these signals are driven by one or more logic gates, and can, therefore, be generated based on the primary signals 212 and circuit relationships between the primary signals 212 and the secondary signals 214 in circuit 200. In some embodiments, the circuit relationships include a gate-circuit topology of at least a portion of the circuit 200. Moreover, the circuit relationships may include a delay associated with one of the logic gates 210.

Moreover, note that logic gates 210 are arranged in two levels 216, where logic gates 210-1 and 210-2 are in level 216-1, and logic gate 210-3 is in level 216-2. As described further below, these levels 216 define an order in which the logic gates 210 can be evaluated in order to determine the secondary signals 214 from the primary signals 212.

During simulations of circuit 200 (or a portion of circuit 200) by a circuit simulator, the dependence of the secondary signals 214 on the primary signals 212 can be leveraged to improve simulation performance and/or to reduce the use of computer-system resources. In particular, the primary signals 212 and the circuit relations may be stored to a file, such as an external file. For example, simulated values of the primary signals 212 at times during a time interval may be stored to the file. Because this file is smaller (because the secondary signals 214 are not stored), less memory is used and there are fewer memory operations. This can reduce the simulation time, which impacts the expense associated with developing an integrated circuit that includes the circuit.

In an exemplary embodiment, the file size is reduced by 3 times (relative to a file that includes the primary signals 212 and the secondary signals 214) and the simulation time is reduced by 2.5 times (relative to a simulation in which the primary signals 212 and the secondary signals 214 are output to the file).

Many circuit simulators include features such as integrated debugging tools. For example, a compiled circuit simulator may include a debugging tool or application in the kernel. This debugging tool may be used to force a given signal, such as one of the primary signals 212 and/or one of the secondary signals 214, to equal a predetermined value or waveform during another time interval. Typically, this time interval is characterized by temporal events where there is a dynamic change in additional relationships of signals associated with circuit 200. For example, a first event may indicate a transition to forcing a signal, such as primary signal 212-1, to have a predetermined value (such as a fixed value), and a second event may indicate that the forcing is discontinued. Other events can include: setting two or more signals (which can be primary signals 212 and/or secondary signals 214) to be identical to each other and/or discontinuing the setting of the signals to be identical to each other. Consequently, during the other time interval, which is defined by two of the temporal events, there is a continuous assignment of one or more signals.

In order to support this functionality, the circuit simulator may store the occurrence of one or more of the temporal events to the file. Additionally, the circuit simulator may store one or more predetermined values or waveforms for signals (which can be primary signals 212 and/or secondary signals 214) during the other time interval.

In order to support user requests for an arbitrary signal in circuit 200 (for example, during waveform viewing, debugging, and/or to generate statistics), after the simulation, the circuit simulator and/or another application (which may be a stand-alone application or a program module or subroutine in another application) may be used to generate one or more of the secondary signals 214 based on the one or more of the primary signals 212 and the circuit relationships stored to the file for time(s) other than when there was a change in the additional relationships (i.e., during the time interval). In addition, for a given signal that is forced (i.e., for a time during the other time interval) the predetermined value or waveform may be used.

Thus, in some embodiments, during the other time interval the stored primary signals 212 in the file may not be used, either directly (if the given signal is one of the primary signals 212) or indirectly (such as, to determine one of the secondary signals 214). However, in some embodiments where there is a continuous assignment of the given signal during the other time interval, such as when the given signal is equal to another signal, one of the stored primary signals 212 may be used (if the given signal is equal to one of the stored primary signals 212).

In some embodiments, generating one or more of the secondary signals 214 may involve evaluating the circuit relationships using priority queuing. Moreover, the generating may be performed more efficiently by using a gate-network levelized representation of circuit 200 (such as a flat-gate circuit), as indicated by levels 216.

Note that because the generating can depend on the temporal events (in particular, for the given signal, there is no generating during the other time interval), secondary signals 214 typically cannot be computed when the circuit simulator is compiled and/or during the simulation.

In some embodiments, circuit 200 includes fewer or additional components. Moreover, two or more components may be combined into a single component and/or a position of one or more components may be changed.

Figure 3:
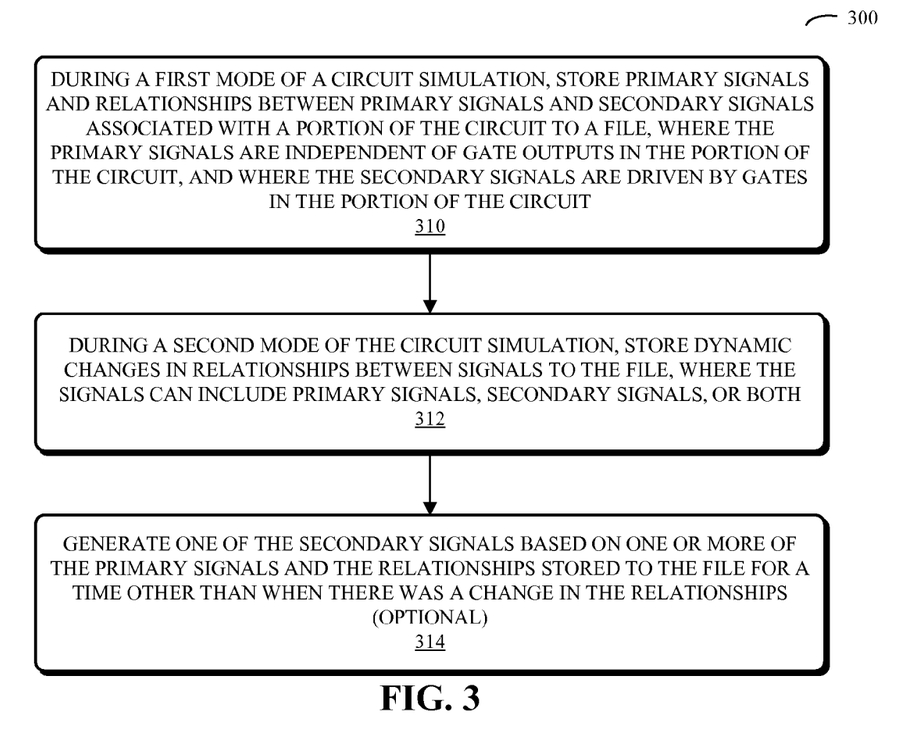
FIG. 3 is a flowchart illustrating a method for simulating a circuit in accordance with an embodiment of the present invention.

We now describe embodiments of a method for simulating the circuit. FIG. 3 presents a flowchart illustrating a method 300 for simulating a circuit, which may be performed by a computer system. During a first mode of the simulation, the computer system stores primary signals and circuit relationships between primary signals and secondary signals associated with a portion of the circuit in a file (310), where the primary signals are independent of gate outputs in the portion of the circuit, and the secondary signals are driven by gates in the portion of the circuit. Moreover, during a second mode of the simulation, the computer system stores dynamic changes in additional relationships between signals to the file (312), where the signals can include primary signals, secondary signals, or both.

In some embodiments, the computer system optionally generates one of the secondary signals based on the one or more of the primary signals and the circuit relationships stored to the file for a time other than when there was a change in the additional relationships (314).

Note that in some embodiments of method 300 there may be additional or fewer operations. Moreover, the order of the operations may be changed and/or two or more operations may be combined into a single operation.

Figure 4:
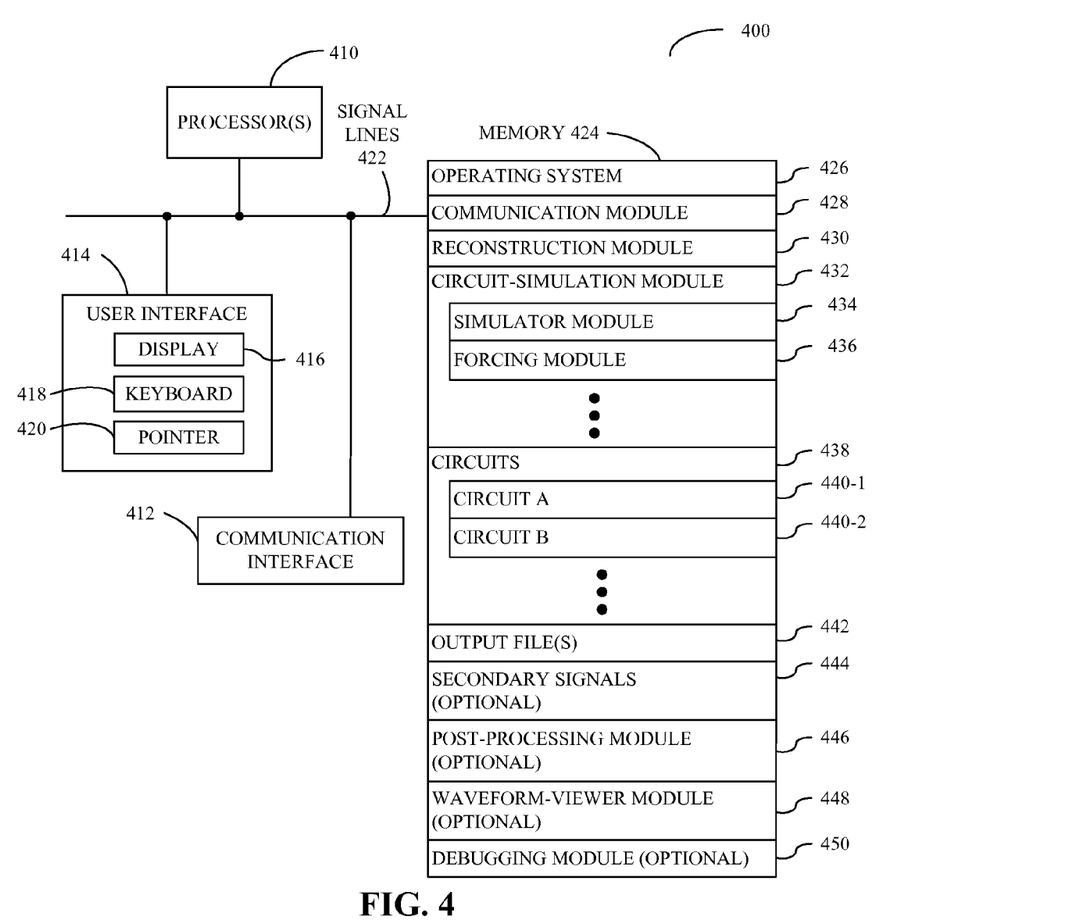
FIG. 4 is a block diagram illustrating a computer system in accordance with an embodiment of the present invention.

We now describe embodiments of a computer system that simulates the circuit. FIG. 4 presents a block diagram illustrating a computer system 400. Computer system 400 includes: one or more processors 410, a communication interface 412, a user interface 414, and one or more signal lines 422 coupling these components together. Note that the one or more processing units 410: may support parallel processing and/or multi-threaded operation, the communication interface 412 may have a persistent communication connection, and the one or more signal lines 422 may constitute a communication bus. Moreover, the user interface 414 may include: a display 416, a keyboard 418, and/or a pointer 420, such as a mouse.

Memory 424 in the computer system 400 may include volatile memory and/or non-volatile memory. More specifically, memory 424 may include: ROM, RAM, EPROM, EEPROM, flash, one or more smart cards, one or more magnetic disc storage devices, and/or one or more optical storage devices. Memory 424 may store an operating system 426 that includes procedures (or a set of instructions) for handling various basic system services for performing hardware-dependent tasks. Memory 424 may also store procedures (or a set of instructions) in a communication module 428. These communication procedures may be used for communicating with one or more computers and/or servers, including computers and/or servers that are remotely located with respect to the computer system 400.

Memory 424 may also include multiple program modules (or a set of instructions), including: reconstruction module 430 (or a set of instructions), circuit-simulation module 432 (or a set of instructions), optional post-processing module 446 (or a set of instructions), optional waveform-viewer module 448 (or a set of instructions), and/or optional debugging module 450 (or a set of instructions). Moreover, circuit-simulation module 432 may include: simulator module 434 (or a set of instructions) and/or forcing module 436 (or a set of instructions).

Simulator module 434 may perform simulations of one or more circuits 438 (or portions of these circuits), such as circuit A 440-1 or circuit B 440-2. During these simulations, simulator module 434 may output primary signals and circuit representations associated with one or more of the circuits 438 to one or more output files 442. Moreover, if there are one or more dynamic changes in one or more additional relationships between the primary signals and/or secondary signals associated with one or more of the circuits 438, such as forcing of a signal by forcing module 436, this information may also be stored to the one or more output files 442.

After a given simulation, reconstruction module 430 may generate optional secondary signals 444 associated with one or more of the circuits 438 based on the information in one or more of the output files 442. Moreover, the primary signals in the one or more of the output files 442 and/or the optional secondary signals 444 may be used by other applications, such as: optional post-processing module 446 (for collecting statistics associated with signals), optional waveform-viewer module 448 (for viewing signals), and/or optional debugging module 450 (for debugging one of the circuits 438).

Instructions in the various modules in the memory 424 may be implemented in: a high-level procedural language, an object-oriented programming language, and/or in an assembly or machine language. Note that the programming language may be compiled or interpreted, e.g., configurable or configured to be executed by the one or more processing units 410.

Although the computer system 400 is illustrated as having a number of discrete items, FIG. 4 is intended to be a functional description of the various features that may be present in the computer system 400 rather than a structural schematic of the embodiments described herein. In practice, and as recognized by those of ordinary skill in the art, the functions of the computer system 400 may be distributed over a large number of servers or computers, with various groups of the servers or computers performing particular subsets of the functions. In some embodiments, some or all of the functionality of the computer system 400 may be implemented in one or more application-specific integrated circuit (ASICs), FPGAs, and/or one or more digital signal processors (DSPs).

Computer system 400 may include fewer components or additional components. Moreover, two or more components may be combined into a single component and/or a position of one or more components may be changed. In some embodiments, the functionality of the computer system 400 may be implemented more in hardware and less in software, or less in hardware and more in software, as is known in the art.

Figure 5:
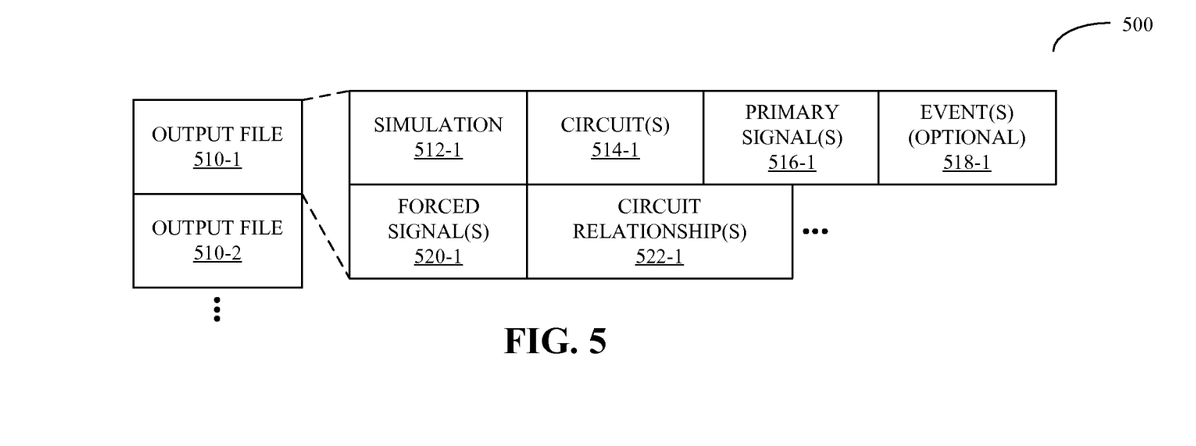
FIG. 5 is a block diagram illustrating a data structure in accordance with an embodiment of the present invention.

We now discuss embodiments of data structures that may be used in the computer system 400. FIG. 5 presents a block diagram illustrating a data structure 500. This data structure may include output files 510. A given output file, such as output file 510-1, may include: a simulation 512-1 to which the entries in output file 510-1 correspond, one or more circuits 514-1 (or portions of circuits), values of one or more primary signals 516-1 as a function of time during one or more time intervals, optional events 518-1 that are associated with dynamic changes in the additional relationships and are associated with one or more other time intervals, one or more forced signals 520-1 that occur during the one or more other time intervals, and/or circuit relationships 522-1 (such as a gate-circuit topology in a portion of one or more of the circuits 514-1) which can be used to generate one or more secondary signals from the one or more primary signals 516-1.

Note that in some embodiments of the data structure 500 there may be fewer or additional components. Moreover, two or more components may be combined into a single component and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for simulating a circuit, comprising:
during a first mode of the simulation, storing a set of primary signals and circuit relationships between the set of primary signals and a set of secondary signals associated with a portion of the circuit, wherein the set of primary signals are independent of gate outputs in the portion of the circuit, wherein the set of secondary signals are driven by gates in the portion of the circuit, and wherein said storing does not store the set of secondary signals;

during a second mode of the simulation, storing dynamic changes in additional relationships between signals to the file, wherein the signals can include primary signals, secondary signals, or both, and wherein the stored dynamic changes specify a time duration when an additional relationship is to be applied to a signal; and determining a secondary signal value at a time instance by:
determining whether or not the additional relationship is to be applied to the secondary signal at the time instance based on the stored dynamic changes in the additional relationships,
in response to determining that the additional relationship is not to be applied to the secondary signal at the time instance, determining the secondary signal value by evaluating the stored circuit relationships based on the stored set of primary signals, and
in response to determining that the additional relationship is to be applied to the secondary signal at the time instance, determining the secondary signal value by evaluating the additional relationship.

2. The method of claim 1, wherein the dynamic changes include events that indicate a temporal transition in the additional relationships.

3. The method of claim 2, wherein the events are associated with a debugging application.

4. The method of claim 2, wherein the events include forcing at least one of the signals to have a predetermined waveform.

5. The method of claim 4, wherein the predetermined waveform includes a fixed value.

6. The method of claim 4, wherein the events include discontinuing the forcing of at least one of the signals to have the predetermined value.

7. The method of claim 6, wherein the predetermined waveform includes a fixed value.

8. The method of claim 2, wherein the events include setting the signals to be identical to each other.

9. The method of claim 8, wherein the events include discontinuing the setting of the signals to be identical to each other.

10. The method of claim 1, wherein the secondary signal is generated using a separate application from that used to perform the simulation.

11. The method of claim 1, wherein generating the secondary signal involves evaluating the circuit relationships using priority queuing.

12. The method of claim 1, wherein the circuit relationships include a gate-circuit topology in the portion of the circuit.

13. The method of claim 12, wherein at least one gate in the portion of the circuit has an associated delay.

14. The method of claim 1, wherein the first mode facilitates reducing the size of the file relative to the size of a second file that includes the set of primary signals and the set of secondary signals.

15. The method of claim 1, wherein the first mode of the simulation facilitates faster simulations than a mode of simulation in which both the set of primary signals and the set of secondary signals are stored to the file.

16. The method of claim 1, wherein the simulation includes a Verilog simulation.

17. The method of claim 1, wherein the simulation includes simulation of circuitry specified in a very-high-speed-integrated-circuit-hardware-description language (VHDL).

18. The method of claim 1, wherein the portion of the circuit includes the entire circuit.

19. A computer-program product for use in conjunction with a computer system, the computer-program product comprising a non-transitory computer-readable storage medium and a computer-program mechanism embedded therein for configuring the computer system to simulate a circuit, the computer-program mechanism including:
instructions for storing a set of primary signals and circuit relationships between the set of primary signals and a set of secondary signals associated with a portion of the circuit, wherein the set of primary signals are independent of gate outputs in the portion of the circuit, wherein the set of secondary signals are driven by gates in the portion of the circuit, and wherein said storing does not store the set of secondary signals;
instructions for storing dynamic changes in additional relationships between signals to the file during a second mode of the simulation, wherein the signals can include primary signals, secondary signals, or both, and wherein the stored dynamic changes specify a time duration when an additional relationship is to be applied to a signal; and
instructions to determine a secondary signal value at a time instance by:
determining whether or not the additional relationship is to be applied to the secondary signal at the time instance based on the stored dynamic changes in the additional relationships,
in response to determining that the additional relationship is not to be applied to the secondary signal at the time instance, determining the secondary signal value by evaluating the stored circuit relationships based on the stored set of primary signals, and
in response to determining that the additional relationship is to be applied to the secondary signal at the time instance, determining the secondary signal value by evaluating the additional relationship.

20. An integrated circuit configured to simulate a circuit, including:
during a first mode of the simulation, the integrated circuit is configured to store a set of primary signals and circuit relationships between the set of primary signals and a set of secondary signals associated with a portion of the circuit, wherein the set of primary signals are independent of gate outputs in the portion of the circuit, wherein the set of secondary signals are driven by gates in the portion of the circuit, and wherein said storing does not store the set of secondary signals;
during a second mode of the simulation, the integrated circuit is configured to store dynamic changes in additional relationships between signals to the file, wherein the signals can include primary signals, secondary signals, or both, and wherein the stored dynamic changes specify a time duration when an additional relationship is to be applied to a signal; and
wherein the integrated circuit is further configured to determine a secondary signal value at a time instance by:
determining whether or not the additional relationship is to be applied to the secondary signal at the time instance based on the stored dynamic changes in the additional relationships, in response to determining that the additional relationship is not to be applied to the secondary signal at the time instance, determining the secondary signal value by evaluating the stored circuit relationships based on the stored set of primary signals, and in response to determining that the additional relationship is to be applied to the secondary signal at the time instance, determining the secondary signal value by evaluating the additional relationship.

21. A computer system, comprising:
a processor;
memory; and
a program module, wherein the program module is stored in the memory and configured to be executed by the processor to simulate a circuit, the program module including:
  instructions for storing a set of primary signals and circuit relationships between the set of primary signals and a set of secondary signals associated with a portion of the circuit, wherein the set of primary signals are independent of gate outputs in the portion of the circuit, wherein the set of secondary signals are driven by gates in the portion of the circuit, and wherein said storing does not store the set of secondary signals;
  instructions for storing dynamic changes in additional relationships between signals to the file during a second mode of the simulation, wherein the signals can include primary signals, secondary signals, or both, and wherein the stored dynamic changes specify a time duration when an additional relationship is to be applied to a signal; and instructions to determine a secondary signal value at a time instance by:
    determining whether or not the additional relationship is to be applied to the secondary signal at the time instance based on the stored dynamic changes in the additional relationships,
    in response to determining that the additional relationship is not to be applied to the secondary signal at the time instance, determining the secondary signal value by evaluating the stored circuit relationships based on the stored set of primary signals, and
    in response to determining that the additional relationship is to be applied to the secondary signal at the time instance, determining the secondary signal value by evaluating the additional relationship.

* * * * *